(12) United States Patent
Ishido

(10) Patent No.: US 8,174,117 B2
(45) Date of Patent: May 8, 2012

(54) SEMICONDUCTOR DEVICE AND METHOD OF MANUFACTURING THE SAME

(75) Inventor: Kiminori Ishido, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 318 days.

(21) Appl. No.: 12/232,786

(22) Filed: Sep. 24, 2008

(65) Prior Publication Data

US 2009/0096095 A1    Apr. 16, 2009

(30) Foreign Application Priority Data

Oct. 12, 2007  (JP) ................................ 2007-266808

(51) Int. Cl.
*H01L 23/48* (2006.01)

(52) U.S. Cl. ........ 257/737; 257/700; 257/701; 257/773; 257/778; 257/E23.006; 257/E23.021; 257/E23.069

(58) Field of Classification Search .................. 257/737, 257/738, 777, 778, 789, 795, E23.011–E23.194, 257/700, 701, 773, E23.006, E21.503, E21.505; 438/612–617, 108; 228/180.22
See application file for complete search history.

(56) References Cited

U.S. PATENT DOCUMENTS

| | | | |
|---|---|---|---|
| 6,744,122 B1 * | 6/2004 | Hashimoto | 257/668 |
| 7,479,407 B2 * | 1/2009 | Gehman et al. | 438/109 |
| 7,508,080 B2 * | 3/2009 | Aoyagi | 257/778 |
| 2005/0121310 A1 * | 6/2005 | Yamada et al. | 204/192.12 |
| 2008/0149369 A1 * | 6/2008 | Kawamura et al. | 174/251 |

FOREIGN PATENT DOCUMENTS

| | | |
|---|---|---|
| CN | 1656862 A | 8/2005 |
| JP | 6-097634 | 8/1994 |
| JP | 2006-019651 | 1/2006 |
| JP | 2006-093493 | 6/2006 |
| WO | WO 03/101164 A1 | 4/2003 |
| WO | WO 2006/126621 A1 | 11/2006 |

OTHER PUBLICATIONS

Chinese Office Action dated Feb. 5, 2010 and English translation thereof.
Chinese Office Action dated Jul. 12, 2010 (with English translation).
Korean Office Action dated Sep. 15, 2010 (with partial English translation).

* cited by examiner

*Primary Examiner* — Jasmine Clark
(74) *Attorney, Agent, or Firm* — McGinn IP Law Group, PLLC

(57) ABSTRACT

Provided is a semiconductor device having a substrate, a semiconductor chip flip-chip mounted on the substrate, and a stacked film provided in a gap between the substrate and the semiconductor chip. The stacked film is composed of a protective film covering the surface of the substrate, and an underfill film formed between the solder resist film and the semiconductor chip. The protective film is roughened on the contact surface brought into contacting said underfill film.

21 Claims, 7 Drawing Sheets

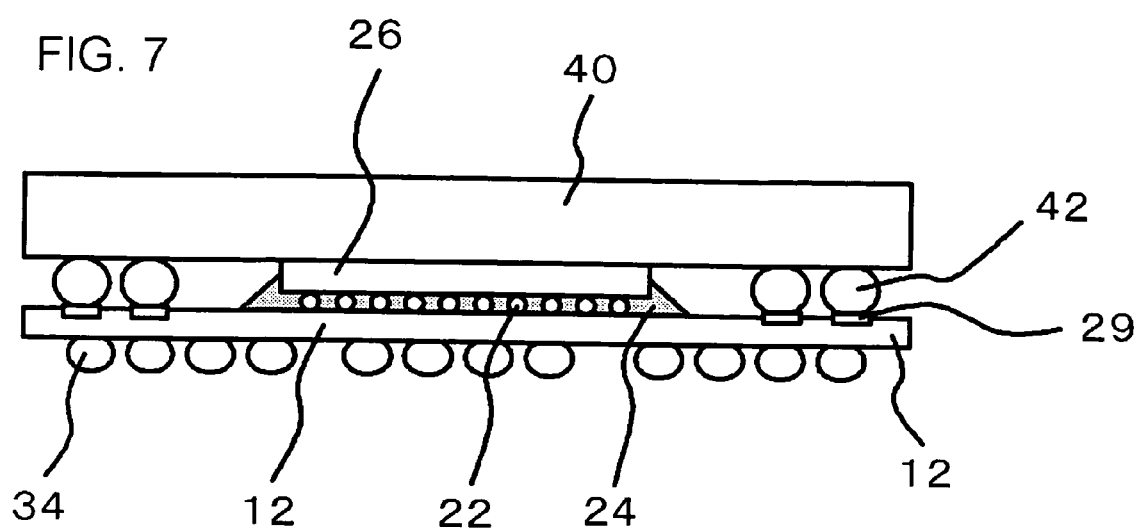

SEMICONDUCTOR DEVICE AND METHOD OF MANUFACTURING THE SAME

This application is based on Japanese patent application No. 2007-266808 the content of which is incorporated hereinto by reference.

BACKGROUND

1. Technical Field

The present invention relates to a semiconductor device having an underfill filled in a gap between a semiconductor chip and a substrate, and a method of manufacturing the same.

2. Related Art

There has been known a conventional printed wiring board described in Japanese Laid-Open Patent Publication No. 2006-93493. The publication describes a printed wiring board having an insulating substrate provided with a protective layer roughened on the surface thereof using a buff or wet blasting, and an insulating base (prepreg) stacked on the protective layer. A film composed of epoxy acrylate resin is used for the protective layer.

The publication describes that such configuration can improve adhesiveness between the protective layer and the insulating base.

Japanese Laid-Open Patent Publication No. H6-97634 describes a printed wiring board having a substrate provided with mounting pads, and a solder resist composed of a dry film and having openings allowing the top surface of the mounting pads to expose therein.

Paragraphs below will explain subjects to be solved by the present invention, referring to FIGS. 4A, 4B and 5 showing a method of manufacturing a semiconductor device.

First, as shown in FIG. 4A, a solder resist film 116 is formed by coating a negative-type liquid solder resist on a substrate 112 having first mounting pads 114 preliminarily formed thereon, and patterning the coated film by photographic development so as to form openings 115.

Next, the solder resist film 116 is subjected to desmearing using a permanganate salt and plasma treatment, so as to achieve a surface roughness Ra (arithmetical mean roughness) of 0.05 µm or larger, to thereby obtain a roughened solder resist film 118 as shown in FIG. 4B.

Then, as shown in FIG. 5A, pretinnings 120 are formed on the first mounting pads 114 on the substrate 112, to thereby obtain a printed wiring board.

Next, as shown in FIG. 5B, mounting pads 128 on the side of a semiconductor chip 126 and the first mounting pads 114 on the substrate 112 side are connected while placing solder bumps 122 in between, to thereby electrically connect the semiconductor chip 126 and the printed wiring board with each other. An underfill material is then filled between the semiconductor chip 126 and the solder resist film 118 so as to form an underfill film 124, to thereby obtain a semiconductor device.

Thus-obtained semiconductor device had, however, still some room for improvement in uniformity of wettability of the solder resist film 118. For this reason, cleanability of the surface of the solder resist film 118 after flip-chip mounting was sometimes insufficient, while leaving residue such as flux on the surface of the solder resist film 118. Bubbles were sometimes produced at the interface between the underfill film 124 and the solder resist film 11. These residue and bubbles were sometimes causative of producing voids in the underfill film 124, and sometimes resulted in inter-bump short circuiting.

In addition, the underfill material sometimes ran out from the gap between the semiconductor chip 126 and the solder resist film 118 in the process of filling, which could inhibit uniform formation of an underfill fillet, could cause bleeding, and could degrade yield of the semiconductor device.

The present invention was conceived after considering the above-described situation, wherein subjects of which reside in providing a semiconductor device suppressed in the inter-bump short circuiting, and a method of manufacturing the same excellent in the yield of product.

SUMMARY

According to the present invention, there is provided a semiconductor device which includes a substrate; a semiconductor chip flip-chip mounted on the substrate; and a stacked film provided in a gap between the substrate and the semiconductor chip, the stacked film is composed of a protective film covering the surface of the substrate, and an underfill film formed between the protective film and the semiconductor chip, wherein the protective film is roughened on the contact surface thereof brought into contacting the underfill film.

Because the surface of the protective film in the present invention is given as a roughened surface, the protective film is improved in the wettability of the surface, so that the underfill layer is prevented from producing voids therein. As a consequence, the inter-bump short circuiting may be suppressed, and the yield of product may be improved.

The yield of the semiconductor device may be improved also because the underfill material is successfully prevented from bleeding out from the gap between the semiconductor chip and the protective film in the process of filling the underfill material.

As is clear from the above, the semiconductor device of the present invention has a configuration capable of ensuring excellent effects in the process of manufacturing.

According to the present invention, there is provided also a method of manufacturing a semiconductor device which includes forming a protective film over a substrate having first mounting pads formed thereon; forming openings in the protective film, so as to allow the first mounting pads to expose at the bottoms thereof; roughening the surface of the protective film; mounting a semiconductor chip in a flip-chip manner on the first mounting pads on the substrate while placing bumps in between; cleaning the surface of the protective film; and forming an underfill film in a gap between the protective film and the semiconductor chip, by filling and curing an underfill material.

The method has the step of cleaning the surface of the protective film, after the surface of the protective film is roughened.

By virtue of this configuration, wettability of the surface of the protective film may be improved, and also a good cleanability of the surface of the protective film may be ensured after the flip-chip mounting. Therefore, production of voids, ascribable to residue of flux or the like and bubbles may be suppressed. The inter-bump short circuiting may consequently be suppressed, and the yield of product may be improved.

Further because the underfill material is filled after the surface of the protective film is roughened and cleaned, the underfill material may successfully prevented from bleeding out from the gap between the semiconductor chip and the protective film, and thereby the yield of product may be improved.

It is to be understood that "fillet geometry" in the context of the present invention means an end profile of the underfill film in the portion thereof which reside as being laid from the edge of the semiconductor chip to the surface of the solder resist.

According to the present invention, a semiconductor device suppressed in inter-bump short circuiting and bleeding of underfill material, and having uniform fillet geometry, and a method capable of manufacturing such semiconductor device in high yield, may be provided.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 is a sectional view explaining a modified example of the semiconductor device of this embodiment.

DETAILED DESCRIPTION

Figure 1A:
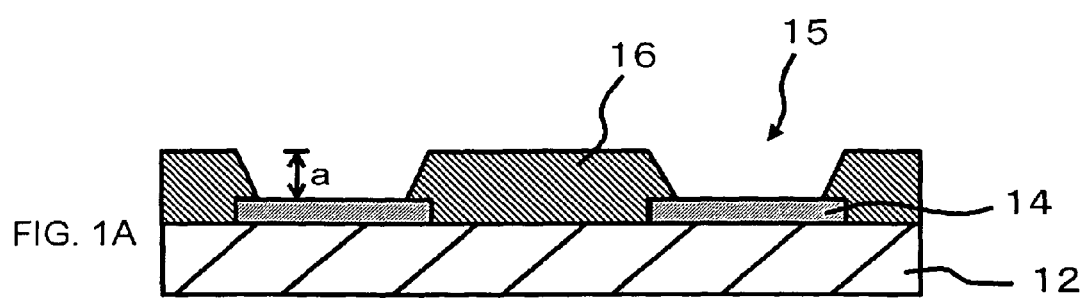
FIGS. 1A to 2B are sectional views schematically showing steps of a method of manufacturing a semiconductor device of one embodiment.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

In all drawings used for explaining embodiments of the present invention, any similar constituents will be given with the same reference numerals, in order to properly avoid repetitive explanation.

Figure 2A:
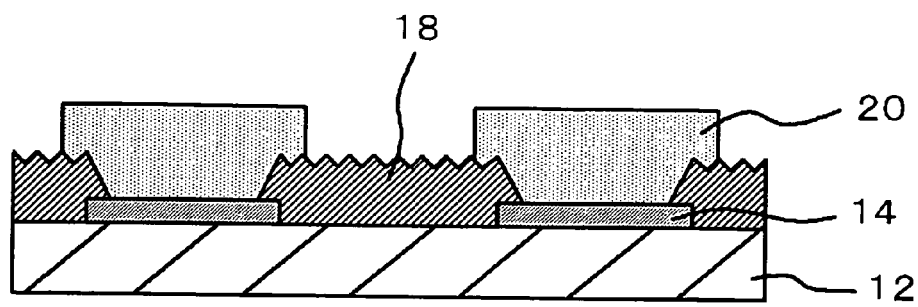
Figure 2B:
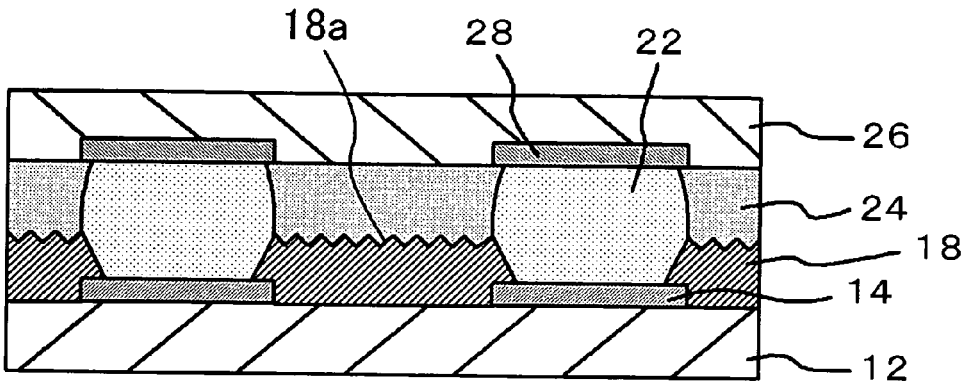
Figure 3:
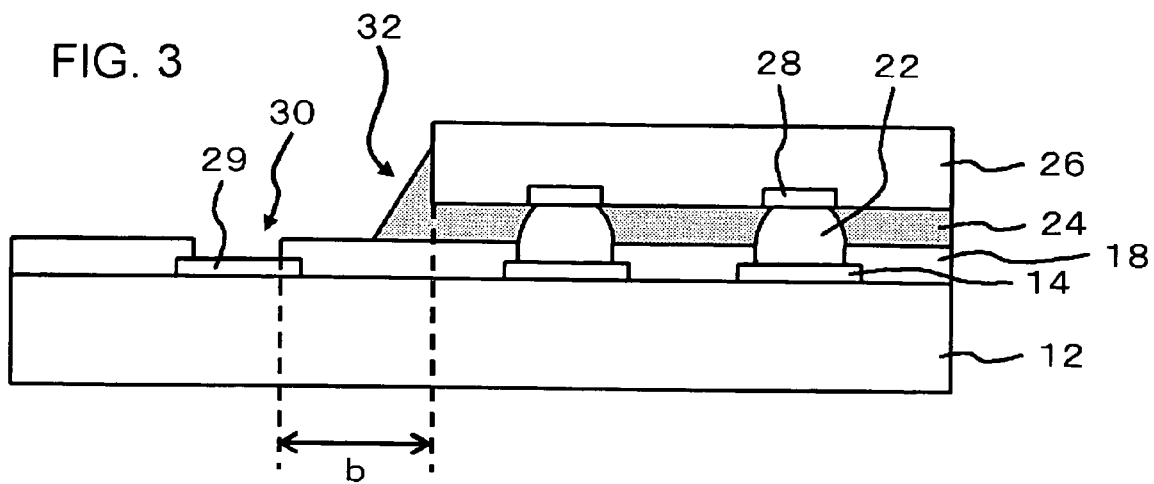
FIG. 3 is a sectional view explaining the end profile of the semiconductor device of this embodiment.

FIG. 2B is a sectional view showing a part of a semiconductor device of this embodiment, and FIG. 3 is a partial sectional view showing an edge portion of the semiconductor device.

As shown in FIG. 2B, the semiconductor device of this embodiment has a substrate 12, a semiconductor chip 26 flip-chip mounted on the substrate 12, and a stacked film filled in a gap between the substrate 12 and the semiconductor chip 26.

The stacked film is composed of a protective film (solder resist film 18) covering the surface of the substrate 12, and an underfill film 24 formed between the solder resist film 18 and the semiconductor chip 26.

The substrate 12 is a printed wiring board, and has a plurality of first mounting pads 14 formed on the surface thereof. On the first mounting pads 14, a semiconductor chip 26 is mounted while placing solder bumps 22 in between. The substrate 12 has a thickness of approximately 0.4 µm.

As shown in FIG. 3, the first mounting pads 14 are formed on the substrate 12 in the region thereof where the semiconductor chip 26 is mounted. In the area surrounding the semiconductor chip 26, second mounting pads 29 are formed. The upper surfaces of the second mounting pads 29 are exposed at the bottoms of openings 30 formed in the solder resist film 18.

Distance b between the edge of the semiconductor chip 26 to the circumference of the surface of the second mounting pad 29 exposed at the bottoms of the openings 30 may be adjusted to approximately 0.5 mm to 2.5 mm.

The solder resist film 18 may be composed of an epoxy resin or the like. Thickness "a" of the solder resist film 18 is adjusted to 5 µm or larger and 30 µm or smaller, and preferably to 5 µm or larger and 15 µm or smaller.

The solder resist film 18 is roughened on the contact surface 18a thereof brought into contacting the underfill film 24. Surface roughness Ra (arithmetical mean roughness) of the contact surface 18a is preferably 0.2 µm or larger and 0.5 µm or smaller. The surface roughness Ra may be measured using an atomic force microscope. The underfill film 24 may be composed of an epoxy resin or the like.

The solder bumps 22 may be composed of lead-free solder. Height of the solder bumps 22 above the solder resist is approximately 50 µm to 100 µm. Pitch of the bumps in the interconnect extension region is approximately 150 µm to 240 µm.

Next, the method of manufacturing the semiconductor device of this embodiment will be explained.

The method of manufacturing the semiconductor device of this embodiment has steps (a) to (f) below.

Step (a): the protective film is formed on the substrate having the first mounting pads formed thereon.

Step (b): the openings, allowing therein the first mounting pads to expose at the bottoms thereof, are formed in the protective film.

Step (c): the surface of the protective film is roughened.

Step (d): a semiconductor chip is mounted in a flip-chip manner on the first mounting pads on the substrate, while placing the bumps in between.

Step (e): the surface of the protective film is cleaned.

Step (f): the underfill film is formed by filling and curing an underfill material in the gap between the protective film and the semiconductor chip.

The above-described steps will sequentially be explained.

Step (a): The protective film is formed on the substrate 12 having the first mounting pads 14 formed thereon.

First, a negative dry-film-type solder resist is laminated to the substrate 12 having the first mounting pads 14 preliminarily formed thereon.

Thickness of the dry-film-type solder resist is selected so that the as-cured thickness "a" thereof may be given as 5 µm or larger 30 µm or smaller on the mounting pads 14 on the substrate 12 side.

A thickness of the solder resist film is preferably 5 µm or larger to 15 µm or smaller. Since the thickness of the solder resist film is thin as above, the geometry of the solder bumps may be optimized and the holding strength against external force may be depended on the underfill film at a maximum. That is, the connecting reliability is improved. An exemplary material adoptable herein for the dry-film-type solder resist may be PFR-800 AUS410 from Taiyo Ink MFG Co., Ltd.

Step (b): the openings 15, allowing therein the first mounting pads 14 to expose at the bottoms thereof, are formed in the protective film.

More specifically, as shown in FIG. 1A, the solder resist film is patterned by a photographic development technique, to thereby form the protective film (solder resist film 16) having the openings 15 allowing therein the surface of the mounting pads 14 to expose at the bottoms thereof.

Step (c): the surface of the protective film (solder resist film 16) is roughened.

Figure 1B:
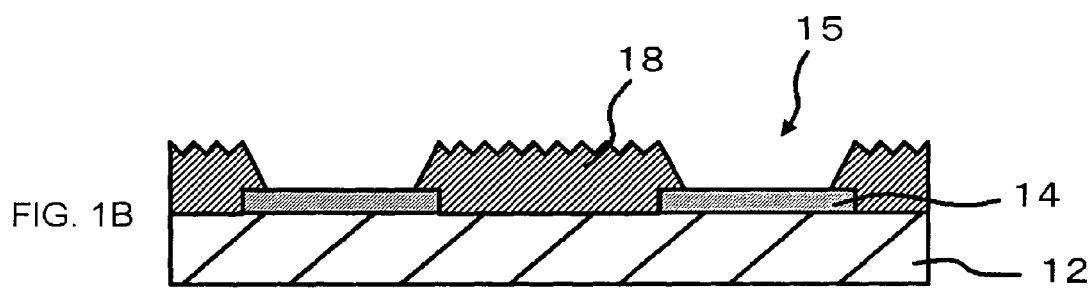

As shown in FIG. 1B, the surface of the solder resist film 16 is roughened, to thereby obtain the roughened solder resist film 18. Roughening may be given so as to achieve a surface roughness Ra (arithmetical mean roughness) of the solder resist film 18 of 0.2 µm or larger 0.5 µm or smaller.

Excessive roughening may embrittle the solder resist film 18 and may be causative of degrading the characteristics, so that surface roughness Ra (arithmetical mean roughness) may preferably be adjusted to 0.5 μm or smaller.

The roughening may be carried out by wet blasting.

Conditions for the wet blasting may involve use of a wide spray gun having an 1-mm-wide slit, use of A#800 alumina abrasive, a distance of the spray gun and the solder resist film 16 of approximately 10 to 30 mm, an air supply pressure of approximately 0.18 to 0.30 MPa, and a process speed of approximately 1.0 to 1.8 m/min.

Step (d): a semiconductor chip 26 is mounted in a flip-chip manner on the first mounting pads 14 on the substrate 12, while placing the bumps 22 in between.

First, as shown in FIG. 2A, pretinnings 20 are formed on the first mounting pads 14 on the substrate 12 side. A printed wiring board provided with the solder resist film 18 having a predetermined surface roughness is thus obtained.

Next, mounting pads 28 of the semiconductor chip 26 and the first mounting pads 14 on the substrate 12 side are connected while placing the bumps 22 in between, to thereby electrically connect the semiconductor chip 26 and the printed wiring board.

Step (e): the surface of the protective film (solder resist film 18) is cleaned.

The cleaning may be carried out using a cleaning liquid such as general alcohol-base solvent or water-base cleaning agent, according to a general method. The solder resist film 18 is improved in the cleanability, by virtue of the roughening to achieve the roughness as described in the above.

Step (f): the underfill film is formed by filling and curing an underfill material in the gap between the protective film (solder resist film 18) and the semiconductor chip 26.

As shown in FIG. 2B, an underfill material is filled in the gap between the semiconductor chip and the solder resist film 18, cured so as to form the underfill film 24, and thereby the semiconductor device may be obtained. The underfill material adoptable herein may be those of epoxy resin base.

After step (f), the semiconductor device may be manufactured by general procedures.

Effects of this embodiment will be explained below.

In this embodiment, the contact surface 18a of the solder resist film 18 is given as a roughened surface. Surface roughness Ra (arithmetical mean roughness) of the contact surface 18a may preferably be adjusted to 0.2 μm or larger and 0.5 μm or smaller.

For this reason, the surface of the solder resist film 18 is improved in the wettability, and allows thorough removal of residues such as flux remaining on the surface of the solder resist film 18 after the flip-chip bonding. Improvement in the wettability of the surface of the solder resist film 18 is also advantageous in terms of suppressing production of bubbles on the surface of the solder resist film 18, in the process of filling the underfill material.

By virtue of this configuration, voids ascribable to the residue and the bubbles may successfully be prevented from generating in the underfill film 24, thereby the inter-bump short circuiting may be suppressed, and the yield of product may be improved.

In addition, the underfill material may successfully be prevented from bleeding out from the gap between the semiconductor chip 26 and the solder resist film 18 in the process of filling thereof, so that the yield of semiconductor device may be improved.

Moreover, the semiconductor device of this embodiment is configured as shown in FIG. 3, wherein the second mounting pads 29 are provided in at least a partial area surrounding the semiconductor chip 26. The surface of the second mounting pads 29 are kept exposed, even after the underfill film was formed.

With recent growing needs for down-sizing, higher processing speed, and lower power consumption of electronic instruments, SiP (system in package) having a plurality of LSI systems integrated in a single package has made a remarkable progress. In association therewith, there has been raised a new demand for a semiconductor device having the surface of mounting pads in the vicinity of a flip-chip-mounted semiconductor chip. The second mounting pads 29 provided in the vicinity of the semiconductor chip 26 allow thereon mounting of still another semiconductor chip or semiconductor package, so as to form an SiP.

Figure 4A:
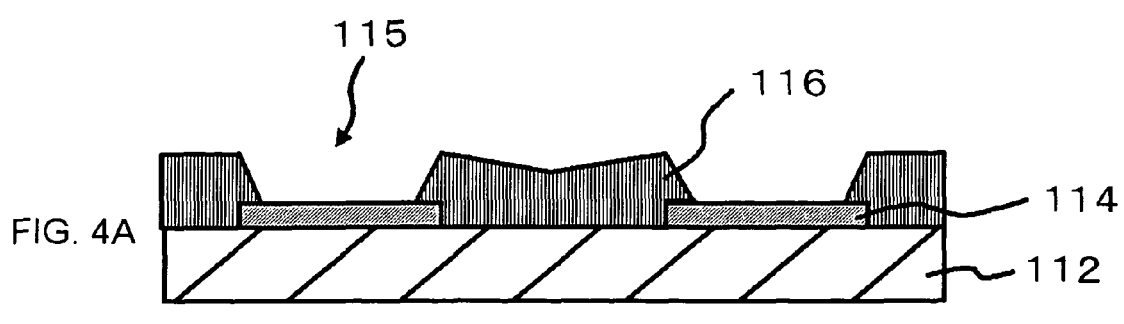
FIGS. 4A to 5B are sectional views shown by steps, explaining a subject of the present invention.
Figure 4B:
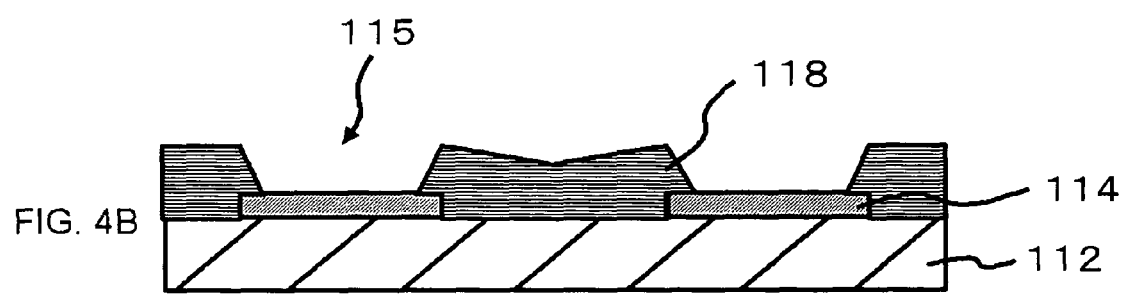
Figure 5A:
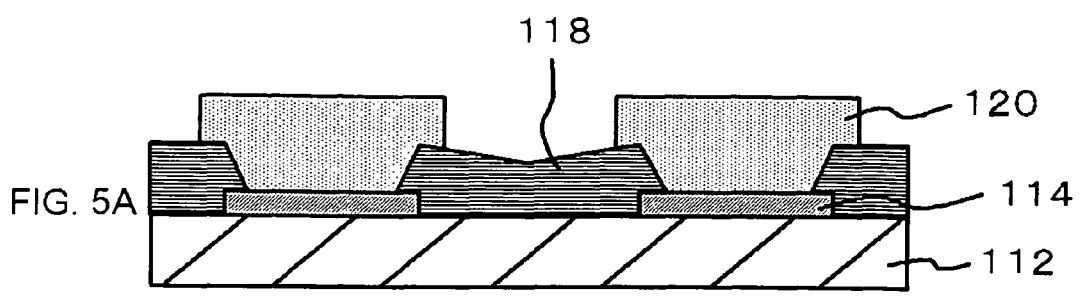
Figure 5B:
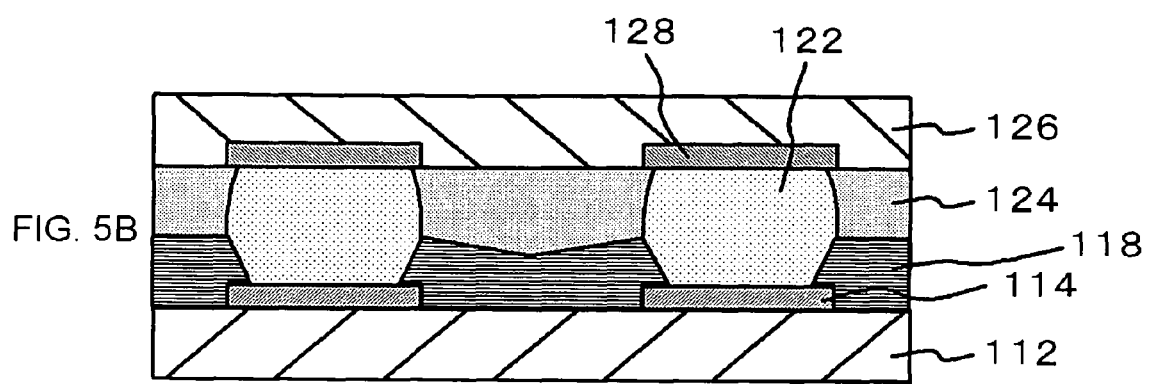

If the solder resist film 118, roughened on the surface thereof to as finely as an arithmetical mean roughness Ra of 0.05 μm or around should be applied to thus-configured semiconductor device as shown in FIGS. 4A, 4B and 5, the underfill material may overflow beyond a predetermined range to spread over the mounting pads 129 provided around the semiconductor chip 126. The end profile (fillet geometry 132) of the underfill film 124 is given as being widened in the transverse direction enough to cover the mounting pads 114, so that the mounting pads 114 are no more available.

The present inventors finally reached the present invention, after finding out such new subject.

More specifically, as shown in FIG. 3, the surface of the solder resist film 18 in this embodiment is given as a roughened surface, wherein the surface roughness Ra (arithmetical mean roughness) of which is preferably adjusted to 0.2 μm or larger and 0.5 μm or smaller.

By virtue of this configuration, the underfill film 24 now has the end profile (fillet geometry 32) thereof settled in a predetermined geometry, prevented from spreading over the second mounting pads 29 provided at around the semiconductor chip 26, and can keep them available. More specifically, another semiconductor chip or another semiconductor package may be connected by flip-chip mounting onto these second mounting pads 29.

The protective film of this embodiment is composed of a dry-film-type solder resist.

By using the dry-film-type solder resist, the solder resist film 18 under the semiconductor chip 26 may be planarized, and thereby the height of gap between the semiconductor chip 26 and the solder resist film 18 may be made uniform.

By virtue of the uniformity in the height of gap between the semiconductor chip 26 and the solder resist film 18 achieved after the flip-chip mounting, cleaning solution can uniformly spread therethrough. By an synergistic effect of the surface roughness of the solder resist film 18 fallen in the above-described range, the cleanability in the process of cleaning after the flip-chip mounting may further be improved.

This is advantageous still also in that the underfill material may be prevented from bleeding.

The embodiments of the present invention have been described in the above referring to the attached drawings, merely as exemplary cases, while allowing adoption of various configurations other than those described in the above.

For example, the second mounting pads 29 provided at around the semiconductor chip 26 may surround the semiconductor chip 26 by two or larger number of rounds.

Alternatively, two or more the semiconductor chips 26 may be mounted in parallel on the substrate 12, and still alternatively, a semiconductor package may be mounted on the substrate 12 from above the semiconductor chip 26.

FIG. 7 shows an example of the semiconductor device having a semiconductor package 40 mounted on the substrate 12 from above the semiconductor chip 26. The semiconductor package 40 has a plurality of solder balls 42, and is mounted on the second mounting pads 29 while placing the solder balls 42 in between. On the back surface of the substrate 12, a plurality of solder balls 34 are provided. The semiconductor device shown in FIG. 7 has a POP (package on package) structure.

Adoption of the semiconductor device of the present invention to the POP structure may successfully prevent the underfill material from bleeding and may help formation of a uniform fillet geometry, so that the second mounting pads 29 will never be covered with the underfill material. The semiconductor package 40 may therefore ensure desirable performance of connection with the second mounting pads 29, and thereby the yield of semiconductor device may be improved.

EXAMPLES

Example 1

The semiconductor device shown in FIG. 2B and FIG. 3 was manufactured according to the conditions described below.
(a) Materials
 Solder resist film 18: epoxy resin film, PFR-800 AUS410 from Taiyo Ink MFG Co., Ltd.
 Underfill film 24: epoxy-base resin; and
 Bumps 22: lead-free solder.
(b) Roughening (Wet Blasting) of Surface of Solder Resist Film 18)

Using a wet blasting apparatus provided with a wide spray gun having an 1-mm-wide slit (product name: Physical Fine Etcher, from Macoho Co., Ltd.), and using A#800 alumina abrasive, wet blasting was carried out while setting the distance between the spray gun and the solder resist film 16 to approximately 10 mm to 30 mm, the air supply pressure to approximately 0.18 MPa to 0.25 MPa, and the process speed to approximately 1.0 m/min to 1.8 m/min.
(c) Method of Measuring Surface Roughness Surface roughness Ra (arithmetical mean roughness) was measured using an atomic force microscope.

The surface roughness Ra of the solder resist film 18 was found to be 0.2 µm.

Example 2

The semiconductor device was manufactured similarly to as described in Example 1, except that the wet blasting of the surface of the solder resist film 18 was carried out while adjusting the air supply pressure to approximately 0.25 MPa to 0.30 MPa.

The surface roughness Ra of the solder resist film 18 was found to be 0.5 µm.

It was confirmed that the semiconductor device obtained in Examples 1, 2 were suppressed in the production of voids in the underfill film 24, and in the inter-bump short circuiting. It was also confirmed that the fillet geometry 32 of the underfill film 24 was settled in a predetermined geometry as shown in FIG. 3, leaving the second mounting pads provided around the semiconductor chip 26 exposed.

Comparative Example 1

The semiconductor device was manufactured similarly to as described in Example 1, except that the solder resist film was wet-blasted using an A#2000 alumina abrasive, under an air supply pressure of approximately 0.05 MPa to 0.13 MPa.

The surface roughness Ra (arithmetical mean roughness) of the solder resist film was found to be 0.1 µm.

Figure 6:
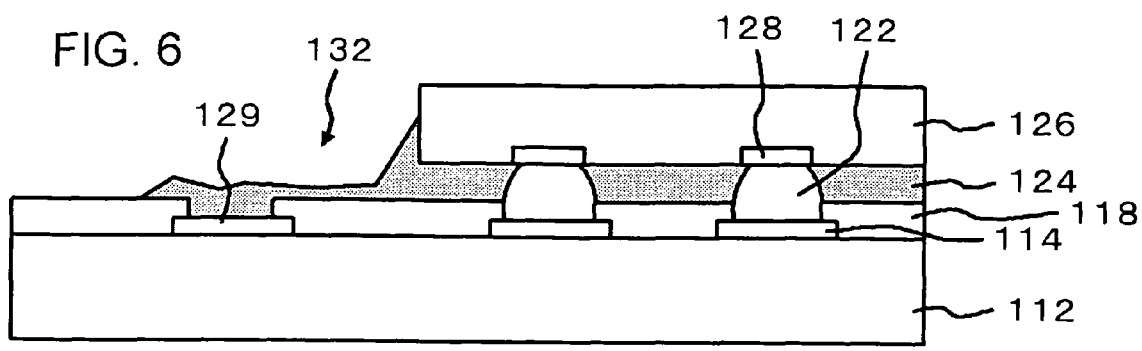
FIG. 6 is a sectional view shown by step, explaining other subject of the present invention.

In the semiconductor device of Comparative Example 1, voids were confirmed in the underfill film, and also the inter-bump short circuiting was confirmed. It was also found that, as shown in FIG. 6, the mounting pads 129 provided at around the semiconductor chip were covered with the underfill film.

Comparative Example 2

The semiconductor device was manufactured similarly to as described in Example 1, except that the solder resist film was wet-blasted using an A#600 alumina abrasive.

The surface roughness Ra (arithmetical mean roughness) of the solder resist film was found to be 0.6 µm.

It was confirmed that, in the semiconductor device of Comparative Example 2, the solder resist film was embrittled, and was therefore degraded in characteristics such as resistance against heat of solder and resistance against chemicals.

It is apparent that the present invention is not limited to the above embodiment, that may be modified and changed without departing from the scope and spirit of the invention.

What is claimed is:
1. A semiconductor device, comprising:
 a substrate;
 a semiconductor chip flip-chip mounted on said substrate; and
 a stacked film provided in a gap between said substrate and said semiconductor chip, said stacked film comprising a protective film covering a surface of said substrate, and an underfill film formed between said protective film and said semiconductor chip,
 wherein said protective film that is roughened on a contact surface thereof abuts a lowermost surface of said underfill film, and
 wherein, said protective film has an arithmetical mean roughness of 0.2 µm or larger and 0.5 µm or smaller on the contact surface thereof brought into contacting said underfill film.
2. The semiconductor device as claimed in claim 1, further comprising:
 first mounting pads formed on said substrate, and connected to said semiconductor chip while placing bumps in between; and
 second mounting pads, different from said first mounting pads, formed on said substrate in at least a partial area thereof surrounding said semiconductor chip.
3. The semiconductor device as claimed in claim 2, wherein said second mounting pads have exposed surfaces.
4. The semiconductor device as claimed in claim 2, further comprising:
 a semiconductor package mounted on said second mounting pads while placing solder balls in between, as being laid over said semiconductor chip.
5. The semiconductor device as claimed in claim 2, wherein a height of the surface of said protective film as measured from a surface of said first mounting pads is 5 µm or larger and 30 µm or smaller.
6. The semiconductor device as claimed in claim 1, wherein said protective film comprises a dry-film-type solder resist.
7. The semiconductor device as claimed in claim 1, wherein the protective film contacts said surface of said substrate.
8. The semiconductor device as claimed in claim 1, further comprising:

a plurality of mounting pads disposed on the surface of said substrate to connect to said semiconductor chip while placing bumps in between.

9. The semiconductor device as claimed in claim 8, further comprising:
a plurality of mounting pads disposed at bottoms of openings formed in the protective film on the surface of said substrate to surround said semiconductor chip.

10. The semiconductor device as claimed in claim 2, wherein second mounting pads are exposed at bottoms of openings formed in the protective film.

11. The semiconductor device as claimed in claim 2, further comprising:
a plurality of solder balls mounted on the second mounting pads to connect to the semiconductor chip.

12. The semiconductor device as claimed in claim 11, wherein said solder balls confine said bumps in between.

13. The semiconductor device as claimed in claim 1, where a bottom surface of said protective film contacts said surface of said substrate.

14. A semiconductor device, comprising:
a substrate;
a semiconductor chip mounted on said substrate;
a protective film contacting a top surface of said substrate; and
an underfill film formed between said protective film and said semiconductor chip,
wherein said protective film comprises a roughened surface that abuts a lowermost surface of said underfill film, and
wherein said protective film has an arithmetical mean roughness of 0.2 μm or larger and 0.5 μm or smaller on a contact surface thereof brought into contacting said underfill film.

15. The semiconductor device as claimed in claim 14, further comprising:
a plurality of mounting pads disposed on the top surface of said substrate to connect to said semiconductor chip while placing bumps in between.

16. The semiconductor device as claimed in claim 14, wherein a bottom surface of said protective film contacts the top surface of said substrate.

17. The semiconductor device as claimed in claim 14, further comprising:
first mounting pads formed on said substrate, and connected to said semiconductor chip while placing bumps in between; and
second mounting pads, different from said first mounting pads, formed on said substrate in at least a partial area thereof surrounding said semiconductor chip.

18. The semiconductor device as claimed in claim 14, wherein said protective film comprises a dry-film-type solder resist.

19. The semiconductor device as claimed in claim 14, wherein, in a plan view, said protective film covers an entirety of said underfill film.

20. A semiconductor device, comprising:
a substrate;
a semiconductor chip flip-chip mounted on said substrate;
a stacked film provided in a gap between said substrate and said semiconductor chip, said stacked film comprising a protective film covering a surface of said substrate, and an underfill film formed between said protective film and said semiconductor chip,
wherein said protective film that is roughened on a contact surface thereof abuts a lowermost surface of said underfill film;
first mounting pads formed on said substrate, and connected to said semiconductor chip while placing bumps in between; and
second mounting pads, different from said first mounting pads, formed on said substrate in at least a partial area thereof surrounding said semiconductor chip,
wherein a height of the surface of said protective film as measured from a surface of said first mounting pads is 5 μm or larger and 30 μm or smaller.

21. A semiconductor device, comprising:
a substrate;
a semiconductor chip mounted on said substrate;
a protective film contacting a top surface of said substrate;
an underfill film formed between said protective film and said semiconductor chip,
wherein said protective film comprises a roughened surface that abuts a lowermost surface of said underfill film;
first mounting pads formed on said substrate, and connected to said semiconductor chip while placing bumps in between; and
second mounting pads, different from said first mounting pads, formed on said substrate in at least a partial area thereof surrounding said semiconductor chip,
wherein a height of the surface of said protective film as measured from a surface of said first mounting pads is 5 μm or larger and 30 μm or smaller.

* * * * *